United States Patent [19]
Schemmel

[11] Patent Number: 5,121,108
[45] Date of Patent: Jun. 9, 1992

[54] CIRCUIT ARRANGEMENT FOR MONITORING TWO OPERATING VOLTAGES

[75] Inventor: Hans-Robert Schemmel, Nürnberg, Fed. Rep. of Germany

[73] Assignee: VLSI Technology, Inc., San Jose, Calif.

[21] Appl. No.: 505,736

[22] Filed: Apr. 5, 1990

[30] Foreign Application Priority Data

Apr. 26, 1989 [DE] Fed. Rep. of Germany ....... 3913666

[51] Int. Cl.$^5$ ............................................. G08B 21/00
[52] U.S. Cl. .................................. 340/660; 340/661; 340/662; 340/663
[58] Field of Search ............... 361/90, 88, 91, 92; 340/660–663; 324/133; 307/130

[56] References Cited

U.S. PATENT DOCUMENTS 3,311,907 3/1967 Teal ..................................... 340/662
3,412,392 11/1968 Jenkins et al. ...................... 340/662

FOREIGN PATENT DOCUMENTS 1144827 3/1963 Fed. Rep. of Germany ...... 340/662
2526346 12/1976 Fed. Rep. of Germany .

OTHER PUBLICATIONS

"Overvoltage/undervoltage Indicator . . . " Ideas for Design; *Electronic Design* vol. 28, No. 11, May 1980; Venkatasubbiah.

Primary Examiner—Edward L. Coles, Sr.
Assistant Examiner—Jill Jackson
Attorney, Agent, or Firm—Clifton L. Anderson

[57] ABSTRACT

A circuit arrangement for monitoring two operating voltages of different polarity detects and indicates the deviation of either operating voltage from its nominal value beyond a predetermined tolerance limit. A transistor is provided, whose base is connected to the positive operating voltage across a first zener diode and to the negative operating voltage through a first resistor, and whose emitter is connected to the negative operating voltage through a series connection of a second zener diode and a second resistor, and to a reference potential across a diode.

10 Claims, 1 Drawing Sheet

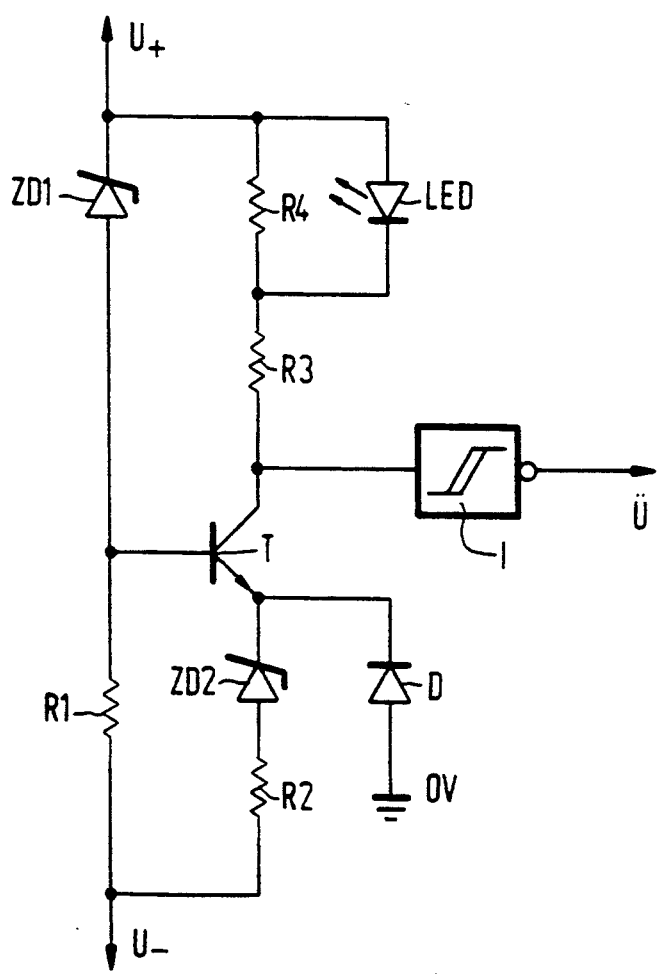

CIRCUIT ARRANGEMENT FOR MONITORING TWO OPERATING VOLTAGES

BACKGROUND OF THE INVENTION

The invention relates to a circuit arrangement for monitoring two operating voltages of different polarity.

Such a circuit arrangement is especially necessary in devices used in information and data technology if an operating voltage deviates from its target value, so as to avoid, for example, erroneous data being output above a certain tolerance limit without this being recognized in time. For this purpose, the failure or the disturbance of an operating voltage is certainly to be indicated or the device switched off automatically.

In DE-C 25 26 346 is disclosed a circuit arrangement for monitoring the failure of one of various operating voltages necessary for operating electronic devices which voltages have different polarities. The circuit arrangement comprises a common reference line and a monitoring relay which is inserted in the power loop of one of the voltages to be monitored, which relay, when one of the voltages to be monitored fails, drops out and triggers an alarm. The relay is connected in series with a switching transistor whose base is connected to a zener diode. If the voltage on the anode of the zener diode drops below 0 volts, the switching transistor will be blocked and the relay will drop out.

SUMMARY OF THE INVENTION

It is an object of the invention to provide a circuit arrangement of the type mentioned above, which can be realized in a simple and cost effective manner with little design effort, has little power consumption, selectable tolerance limits and high precision and which will certainly respond to both operating voltages.

This object is achieved by means of a circuit arrangement of the type set forth in the opening paragraph, in that a transistor is provided whose base is connected to the positive first operating voltage across a first zener diode and to the negative second operating voltage through a first resistor, and whose emitter is connected to the negative second operating voltage through a series connection of a second zener diode and a second resistor and to a reference potential across a diode.

At very little cost of components and with very little power consumption the circuit arrangement enables a reliable monitoring of two operating voltages.

BRIEF DESCRIPTION OF THE DRAWING

The invention will be explained in more detail with reference to the drawing wherein:

The sole FIGURE shows a circuit arrangement in accordance with an exemplary embodiment of the invention for monitoring two operating voltages.

DETAILED DESCRIPTION OF THE EXEMPLARY EMBODIMENT

The sole Figure shows a circuit arrangement for monitoring a positive operating voltage U+ and a negative operating voltage U−. The positive operating voltage U+ is connected to the cathode of a first zener diode ZD1. The anode of the zener diode ZD1 is connected to the base of a transistor T. The negative operating voltage U− in the exemplary embodiment represented in the drawing Figure is connected to the emitter of the transistor T through the series connection of a second resistor R2 and a second zener diode ZD2, the cathode of the zener diode Z2 being connected to the emitter of the transistor T. The emitter of the transistor T is further connected to the cathode of a diode D switched to ground potential OV. Between the base of transistor T and the negative operating voltage U− a first resistor R1 is inserted. The collector of the transistor T is connected to the positive operating voltage U+ through a resistor R3 and a further resistor R4 connected in series therewith. A light emitting diode LED used as an indicator is connected in parallel with the resistor R4. The collector of the transistor T is further connected to a monitoring arrangement producing a monitoring signal Ü. In the exemplary embodiment represented in the drawing Figure the monitoring arrangement is constituted by an inverter I with a hysteresis, which forms a monitoring signal Ü from the voltage available at the collector of transistor T.

In a practical embodiment of the circuit arrangement the positive operating voltage is +5 volts, the negative operating voltage is −12 volts. In addition, the zener voltage of the zener diode ZD1 is dimensioned at 4.7 volts and that of the zener diode ZD2 at 8.2 volts.

If the operating voltages U+, U− in the exemplary embodiment represented in the drawing Figure are undisturbed, a current will flow through the resistors R1, R2 across the zener diodes ZD1, ZD2 biased in the reverse direction. The resistance of the resistor R1 in the practical embodiment of the circuit arrangement is approx. 4 kOhms, that of the resistor R2 is approx. 200 Ohms. The transistor T is thus conductive, that is to say, the light emitting diode LED lights up and indicates in this manner the undisturbed operating condition. The positive voltage occurring at the collector of the transistor T is applied to the inverter I realized as a Schmitt-trigger with a hysteresis in the exemplary embodiment, so that the digital monitoring signal Ü is not released. The resistor R3 in the practical embodiment of the circuit arrangement is dimensioned at approx. 200 Ohms and the resistor R4 at approx. 1 kOhm. For example, the HCMOS module 74HC14 may be inserted as an inverter.

If there is a disturbance, that is to say, if the positive operating voltage U+ drops and/or the negative operating voltage U− rises, the current flow through the resistor R1, R2 respectively, will be interrupted, the transistor T will be blocked and the light emitting diode LED will go out. Consequently, the failure of at least one of the two operating voltages U+, U− will be noticed by an operator. If there is a disturbance, the monitoring signal Ü, especially for resetting microprocessors or initiating safety measures, will be released simultaneously. The response thresholds for blocking the transistor T and hence the tolerance limits for monitoring the operating voltages U+, U− can be determined by means of the choice of the zener diodes ZD1, ZD2.

I claim:

1. A circuit arrangement for monitoring a positive first operating voltage (U+) and a negative second operating voltage (U−), comprising a transistor (T) whose base is connected to the positive first operating voltage (U+) through a first zener diode (ZD1) and to the negative second operating voltage (U−) through a first resistor (R1); and whose emitter is connected to the negative second operating voltage (U−) through a series connection of a second zener diode (ZD2) and a second resistor (R2) and to a reference potential (OV)

through a diode (D), and a monitoring device coupled to said transistor for providing a monitoring signal (Ü) as a function of the level of said first and second voltages.

2. A circuit arrangement as claimed in claim 1, characterized in that a light emitting diode (LED) indicator is coupled to the collector of said transistor.

3. A circuit arrangement as claimed in claim 1, characterized in that the first operating voltage (U+) is connected to the cathode of the first zener diode (ZD1) and in that the second operating voltage (U−) is connected to the anode of the second zener diode (ZD2) through the second resistor (R2).

4. A circuit arrangement as claimed in claim 1, characterized in that the collector of the transistor (T) is connected to said monitoring device releasing said monitoring signal (Ü).

5. A circuit arrangement as claimed in claim 1, characterized in that the first and second zener diodes (ZD1, ZD2) are biased in a reverse direction.

6. A circuit arrangement as claimed in claim 1, characterized in that the monitoring device is arranged as an inverter (I).

7. A circuit arrangement as claimed in claim 1, characterized in that the collector of the transistor (T) is connected to the first operating voltage (U+) through a series connection of third and fourth resistors (R3, R4), an indicator (LED) being connected in parallel with the fourth resistor (R4) connected to the first operating voltage (U+).

8. A circuit arrangement as claimed in claim 7, characterized in that the first operating voltage (U+) is connected to the cathode of the first zener diode (ZD1) and in that the second operating voltage (U−) is connected to the anode of the second zener diode (ZD2) through the second resistor (R2).

9. A circuit arrangement as claimed in claim 7, characterized in that the collector of the transistor (T) is connected to the monitoring device.

10. A circuit arrangement as claimed in claim 7, characterized in that the collector of the transistor (T) is connected to the monitoring device.

* * * * *